United States Patent [19]
Doi et al.

[11] Patent Number: 5,356,661
[45] Date of Patent: Oct. 18, 1994

[54] HEAT TRANSFER INSULATED PARTS AND MANUFACTURING METHOD THEREOF

[75] Inventors: Akira Doi; Shosaku Yamanaka; Hiromu Kawai, all of Hyogo, Japan

[73] Assignee: Sumitomo Electric Industries, Ltd., Osaka, Japan

[21] Appl. No.: 39,803

[22] Filed: Mar. 29, 1993

Related U.S. Application Data

[62] Division of Ser. No. 616,893, Nov. 21, 1990, abandoned.

[51] Int. Cl.$^5$ ............................................. C23C 16/00
[52] U.S. Cl. ................................ 427/124; 427/126.1; 427/126.4; 427/255.1; 427/405; 427/419.7; 427/529; 427/530
[58] Field of Search .................. 427/124, 126.4, 126.1, 427/255.1, 529, 530, 405, 419.7

[56] References Cited

U.S. PATENT DOCUMENTS

| | | | |
|---|---|---|---|
| 3,604,970 | 9/1971 | Culbertson | 427/124 |
| 3,697,343 | 10/1972 | Cuomo | 427/124 |
| 4,401,719 | 8/1983 | Kobayashi | 427/530 |
| 4,480,010 | 10/1984 | Sasanuma | 427/530 |
| 4,532,190 | 7/1985 | Kanbe | 428/627 |
| 4,598,025 | 7/1986 | Mizuhara | 428/627 |
| 4,777,060 | 10/1988 | Mayr | 427/126.4 |
| 4,994,301 | 2/1991 | Kusumoto | 427/124 |
| 5,079,089 | 1/1992 | Ito | 428/336 |
| 5,192,410 | 3/1993 | Ito | 427/529 |
| 5,192,589 | 3/1993 | Sandhu | 427/255.1 |

FOREIGN PATENT DOCUMENTS

| | | | |
|---|---|---|---|
| 9108322 | 6/1991 | PCT Int'l Appl. | 427/255.1 |
| 2163456 | 2/1986 | United Kingdom | 427/530 |

OTHER PUBLICATIONS

M. Fukutomi et al "Silicon Nitride Coatings on Molybdenum by RF Reactive Ion Plating". J. Electrochem. Soc. vol. 124, No. 9 Sep. 1977, pp. 1420–1424.

M. Kobayashi et al "TiN and TiC Coating on Cemented Carbides by Ion Plating" Thin Solid Films 54, 1978, pp. 67–74.

Primary Examiner—Shrive Beck
Assistant Examiner—Vi Duong Dang
Attorney, Agent, or Firm—W. G. Fasse; W. F. Fasse

[57] ABSTRACT

A heat transfer insulated part including a heat transfer substrate formed of a sintered metal of Cu-W or Cu-Mo, an insulating ceramic layer for electrically insulating the heat transfer substrate, formed of ceramic such as $Al_2O_3$, $SiO_2$ and $Si_3N_4$, and a barrier layer provided between the heat transfer substrate and an insulating ceramic layer composed of at least either one of metal layers of W and Mo. Furthermore, preferably, an intermediate layer composed of titanium carbide and/or titanium nitride and so forth for enhancing the adhesive property between the insulating ceramic layer and the barrier layer is provided.

13 Claims, 3 Drawing Sheets

HEAT TRANSFER INSULATED PARTS AND MANUFACTURING METHOD THEREOF

CROSS-REFERENCE TO RELATED APPLICATIONS

This is a divisional of U.S. patent application Ser. No. 07/616,893 filed Nov. 21, 1990 now abandoned.

BACKGROUND OF THE INVENTION

1. Field of the Invention

The present invention relates to heat transfer insulated parts which can be used as heat transfer parts, high heat transfer substrates and..so forth to be provided in Multi Layer Ceramic Packages (FLLCP), etc. and a manufacturing method thereof.

2. Description of the Background Art

Multilayer ceramic packages have a structure in which sintered alumina are stacked. The multilayer cemraic packages are provided with heat transfer substrates on which LSI chips or the like are mounted and heat transfer caps. As conventional heat transfer substrate portions and heat transfer cap portions, Cu-W sintered body, BeO sintered body, SiC sintered body, and AlN sintered body etc. are employed.

The Cu-W sintered body, as it is not an electric insulator, could not be used for package parts having a structure in which electric short of the parts is a problem. Accordingly, a package in which alumina multilayers and the Cu-W sintered body are integrally encapsulated has been mainly used in a product having no problem of electric short through the Cu-W.

However, for some applications, it was desirabale that the excellent heat dissipation capacity of the Cu-W sintered body was utilized. In such a case, an alumina sheet is stacked on a Cu-W sintered body, or an insulating film such as an $Al_2O_3$ film is deposited on the surface of the Cu-W sintered body. However, in the case where an alumina sheet is stacked, problems occur such as that the dimension of the entire package is large, the heat dissipation capacity decreases, or a complicated package structure costs much. In the case where an insulating film such as an $Al_2O_3$ film is deposited, Cu diffuses from a heat transfer substrate into the insulating film to reach the surface of the insulating film due to heating at 900° C., for example, in the package assembling process, so that they have caused problems such as inferior insulating.

When SiC or AlN sintered body is employed, because of the large difference of thermal expansion coefficient between the heat transfer substrate and multilayered alumina, they had a problem that cracks occur at the junction in the glass encapsulation process.

In case of the BeO sintered body, since it includes harmful beryllium, it is facing a difficult situation which might lead to stop of manufacturing in view of a problem of environmental pollution.

SUMMARY OF THE INVENTION

It is an object of the present invention to provide heat transfer insulated parts having excellent insulating capability and heat dissipation capacity which are not cracked even if glass-encapsulated, and a manufacturing method thereof.

A heat transfer insulated part according to the present invention includes a heat transfer substrate, an insulating ceramic layer, and a barrier layer provided between the heat transfer substrate and the insulating ceramic layer.

According to the present invention, the heat transfer substrate is formed of a sintered alloy of Cu-W or Cu-Mo.

According to the present invention, the barrier layer is formed of at least either one of the metal layers of W and Mo. Accordingly, the barrier layer may include a single layer or a layer structure of a plurality of stacked layers.

in the present invention, the insulating ceramic layer is a layer provided for electrically insulating the heat transfer substrate. The insulating ceramic layer is preferably selected from the group consisting of $Al_2O_3$, $SiO_2$ and $Si_3N_4$.

The sintered alloys of Cu-W and Cu-Mo employed as a heat transfer substrate in the present invention has an excellent thermal dissipation capability resulted from large thermal conductivity and diffusivity of heat. Furthermore, the thermal expansion coefficients of these sintered alloys are close to that of alumina of the multi-layers, so that it has an excellent matching ability in the thermal expansion. These excellent heat dissipation capacity and matching ability of the thermal expansion do not decrease almost at all even when a barrier layer according to the present invention is provided.

In the present invention, the barrier layer is formed of (a) metal layer(s) of W and/or Mo. The barrier layer prevents Cu diffusion from the heat transfer substrate into the insulating ceramic layer due to heating at about 900° C. in the package assembling process, for example. Therefore, according to the present invention, the inferior insulating due to diffusion of Cu into the insulating ceramic layer can be avoided.

The thickness of the barrier layer is preferably 1–10 μm as a whole. If the thickness is smaller than 1 μm, it does not have a sufficient effect as a barrier layer in some cases. If the thickness of the barrier layer exceeds 10 μm, there is a fear that the thermal conductivity decreases as a heat transfer insulated part.

In the present invention, W and Mo are used as a barrier layer because the thermal expansion coefficients of these metals are close to those of Cu-W and Cu-Mo which are materials of a heat transfer substrate, and the constitution does not change considerably due to heating in the manufacturing process as these metals are refractory metals.

In the present invention, the barrier layer may be a metal layer of W or Mo, or may be composite layer of the two. These barrier layers are effective for both of Cu-W and Cu-Mo heat transfer substrate. However, when Cu-W is employed as a heat transfer substrate, W is preferably employed as a barrier layer, and when Cu-Mo is employed as a heat transfer substrate, Mo is preferably employed as a barrier layer.

In the present invention, the selection of the material of the insulating ceramic layer has no special restriction as long as it can electrically insulate a heat transfer substrate. As an insulating ceramic layer, as described above, $Al_2O_3$, $SiO_2$ or $Si_3N_4$ can be preferably used. $Al_2O_3$, with small difference of thermal expansion coefficients from a Cu-W sintered alloy, is the most appropriate as an insulating ceramic layer when the sintered alloy is employed as a heat transfer substrate. However, depending on the application and a heat transfer substrate, $SiO_2$ or $Si_3N_4$ may be employed.

The insulating ceramic layer must be able to electrically insulate a heat transfer substrate from a plating layer even when conductive plating such as Au plating is applied to the surface thereof in the following steps. The thickness of the insulating ceramic layer is preferably 1–20μm. If the thickness of the insulating ceramic layer is less than 1 μm, pinholes are apt to be induced and a desired insulating capability is not obtained in some cases. Also, in view of the withstanding voltage, it is preferable that the thickness thereof is 1 μm or more. If the thickness exceeds 20 μm, cracks occur in some cases due to residual stress in the insulating ceramic layer.

In one preferable embodiment according to the present invention, an insulating ceramic layer is formed directly on a barrier layer.

According to another preferable embodiment of the present invention, an intermediate layer is formed on a barrier layer, and an insulating ceramic layer is formed thereon. The intermediate layer is provided in order to enhance the adhesive properties of an insulating ceramic layer and a barrier layer. As such an intermediate layer, carbide and/or nitride of metals of IV, V or VI groups in a periodic table are preferably used. As such a metal, Ti is especially preferable. Accordingly, as an intermediate layer, TiC, Ti (C, N) and TiN are especially preferable. Such intermediate layers have good affinity not only with W and Mo metals but also with insulating ceramic layers of such as $Al_2O_3$, $SiO_2$ and $Si_3N_4$, so that it enhances the adhesive properties of the insulating ceramic layer and the barrier layer.

The thickness of an intermediate layer is preferably 1–5 μm. If the thickness of an intermediate layer is less than 1 μm, pinholes are induced in an intermediate layer in some cases. If the thickness of an intermediate layer exceeds 5 μm, the thermal conductivity as a heat transfer insulated part may be decreased.

When an insulating ceramic layer is an oxide film of such as $Al_2O_3$ and $SiO_2$, TiC is especially preferable as an intermediate layer. When the insulating ceramic layer includes a nitride film of such as $Si_3N_4$, TiN is especially preferable. In this case, a laminating structure in which a TiC layer is formed on the side of the barrier layer and a TiN layer is formed on the side of the insulating ceramic layer, or a structure of graded composition in which the composition gradually changes from TiC to TiN in the direction from a barrier layer to an insulating ceramic layer is more effective in the aspect of improvement in the adhesive properties.

The manufacturing method according to the present invention includes the step of forming a barrier layer composed of at least either one of metal layers of W and Mo above a heat transfer substrate formed of a sintered alloy of Cu-W or Cu-Mo and the step of forming an insulating ceramic layer for electrically insulating a heat transfer substrate above the barrier layer.

Furthermore, when an intermediate layer is formed between a barrier layer and an insulating ceramic layer, the step of forming the insulating ceramic layer includes the step of forming an intermediate layer on the barrier layer.

The Cu-W sintered alloy and the Cu-Mo sintered alloy employed as a heat transfer substrate in the present invention can be manufactured by a conventionally well known technique for manufacturing this kind of sintered alloy.

In the manufacturing method of the present invention, the barrier layer is preferably formed by the thermal CVD method or the plasma CVD method using $WF_6$ or $MoF_6$ as a raw material gas.

The insulating ceramic layer is preferably formed by the CVD method, the plasma CVD method or the ion plating method. When a $SiO_2$ film is formed as an insulating ceramic layer, the ion plating method is especially preferable.

When forming an intermediate layer, it is also preferably formed by the CVD method, the plasma CVD method or the ion plating method.

A barrier layer is formed between an insulating ceramic layer and a heat transfer substrate in a heat transfer insulated part according to the present invention, so that the diffusion of Cu from the heat transfer substrate into the insulating ceramic layer is avoided to prevent a decrease in the insulating capability of the insulating ceramic layer. Accordingly, the heat transfer insulated parts according to the present invention have excellent insulating capability and heat dissipation capacity.

Providing an intermediate layer between an insulating ceramic layer and a barrier layer enhances the adhesive properties of the insulating ceramic layer and the barrier layer and prevents cracks from occurring.

Accordingly, when the heat transfer insulated parts of the present invention are used as insulated heat transfer parts for multilayer packages for mounting LSI, microwave devices, high-frequency large electric power transistors, FE and so forth, packages having extremely excellent airtightness and heat transfer can be obtained, so that it is very useful.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
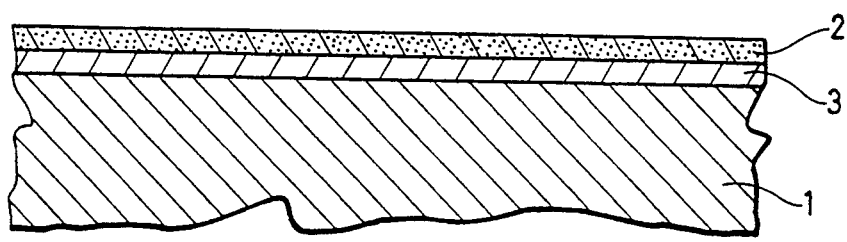
FIG. 1 is a sectional view showing one embodiment according to the present invention.

Referring to FIG. 1, according to one embodiment of the present invention, a barrier layer 3 is provided on a heat transfer substrate 1. On barrier layer 3, an insulating ceramic layer 2 is provided. Because of such a barrier layer 3, the diffusion of Cu from heat transfer substrate 1 to insulating ceramic layer 2 is avoided.

Figure 2:
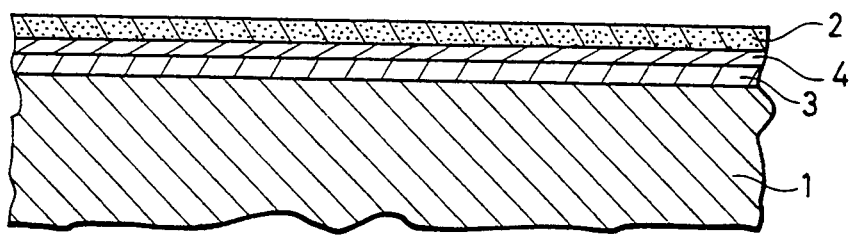
FIG. 2 is a sectional view showing another embodiment according to the present invention.

Referring to FIG. 2, according to another embodiment of the present invention, a barrier layer 3 is provided on a heat transfer substrate 1 and an intermediate layer 4 is provided on the barrier layer 3. An insulating ceramic layer 2 is provided on the intermediate layer 4. The intermediate layer 4 enhances the adhesive property with respect to the barrier layer 3 and the insulating ceramic layer 2.

Examples for manufacturing heat transfer insulated parts according to the present invention and loading the same in various packages will be described below. In the description below, % means percentage by weight.

EXAMPLE 1

A sintered alloy of composition of 10% Cu-90% W is coated with a W layer as a barrier layer with a thickness of 5 μm by the CVD method employing a mixed gas of $WF_6$ and $H_2$. Subsequently, on the W layer as a barrier layer, an $Al_2O_3$ film with a thickness of 7 μm is formed as an insulating ceramic layer.

Figure 3:
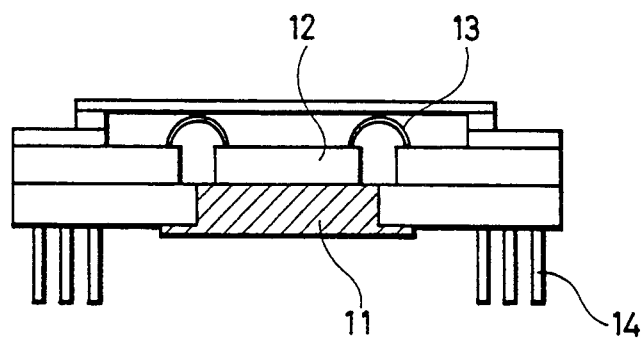
FIG. 3 is a sectional view showing a multilayer package to which a heat transfer insulated part of the example 1 according to the present invention is attached.

FIG. 3 is a sectional view showing a multilayer package for LSI in which a heat transfer insulated part obtained in this way is provided as a heat transfer substrate portion. Referring to FIG. 3, a heat transfer substrate portion 11 which is a heat transfer insulated part of this example is provided under a LSI chip 12. One end of a bonding wire 13 is connected to LSI chip 12. A pin 14 is provided in the lower portion of the package.

The multilayer package for LSI had extremely excellent airtightness and heat dissipation capacity.

EXAMPLE 2

A sintered alloy of composition of 15%Cu-85%W is coated with a W layer with a thickness of 10 μm as a barrier layer by the plasma CVD method employing a mixed gas of $WF_6$ and $H_2$. Subsequently, by the CVD method, an $Al_2O_3$ film with a thickness of 6 μm is formed as an insulating ceramic layer.

Figure 4:
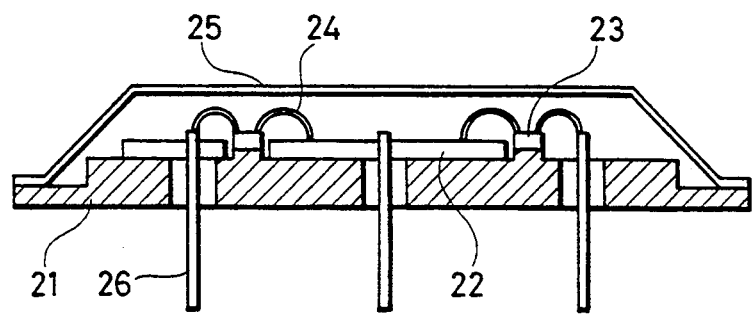
FIG. 4 is a sectional view showing a package for a microwave device to which a heat transfer insulated part of the example 2 according to the present invention is attached.

FIG. 4 is a sectional view showing a package for a microwave device manufactured using a heat transfer insulated part obtained in this way. Referring to FIG. 4, the obtained heat transfer insulated part is used in the package as a heat transfer substrate 21. An alumina based microwave circuit 22 and a semiconductor chip 23 are provided on heat transfer substrate 21. The semiconductor chip 23 is a silicon or GaAs chip. 24 denotes a bonding wire, 25 denotes a case, and 26 denotes a pin.

The package for a microwave device has excellent airtightness and heat dissipation capacity.

EXAMPLE 3

A sintered alloy of composition of 15%Cu-85%Mo is coated with Mo to a thickness of 5 μm by the ion plating method to form a barrier layer. Subsequently, by the plasma CVD method, an $Al_2O_3$ film with a thickness of 10 μm is formed as an insulating ceramic layer.

Using the heat transfer insulated part obtained as described above in combination with an alumina multilayer substrate, an MLCP similar to that shown in FIG. 3 was manufactured. The MLCP was a package having excellent air-tightness and heat dissipation capacity.

EXAMPLE 4

Except that the coating method of Mo in the example 3 is changed to the CVD method, a heat transfer insulated part was manufactured under conditions same as those of the example 3. The obtained heat transfer insulated part is employed in a FLLCP similar to that in example 3, which served as a package having excellent airtightness and heat dissipation capacity.

EXAMPLE 5

A sintered alloy of composition of 15%Cu-85%W is coated with Mo with a thickness of 7 μm by the CVD method employing a mixed gas of $MoF_6$ and $H_2$ to form a barrier layer. Subsequently, on the barrier layer, an $Al_2O_3$ film with a thickness of 9 μm is formed as an insulating ceramic layer by the ion plating method.

Figure 5:
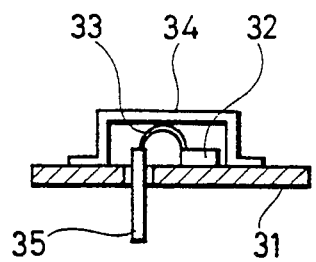
FIG. 5 is a sectional view showing a package employing a heat transfer insulated part of the example 5 according to the present invention as a substrate of a transistor.

FIG. 5 is a sectional view showing a package in which the heat transfer insulated part obtained in this way is employed as a substrate of a transistor or a base metal. Referring to FIG. 5, a Si chip 32 is mounted on a base metal 31, and one end of a bonding wire 33 is connected to the connecting pad of Si chip 32 and the other end thereof is connected to the top surface of a pin 25. 34 denotes a case.

The package was a package having excellent airtightness and heat dissipation capacity.

EXAMPLE 6

A sintered alloy of composition of 20%Cu-80%W is coated with W with a thickness of 6 μm to form a barrier layer. On the barrier layer, a TiC film with a thickness of 2 μm is formed by the CVD method to form an intermediate layer. Subsequently, on the intermediate layer, an $Al_2O_3$ film with a thickness of 7 μm is formed by the plasma CVD method to form an insulating ceramic layer.

Figure 6:
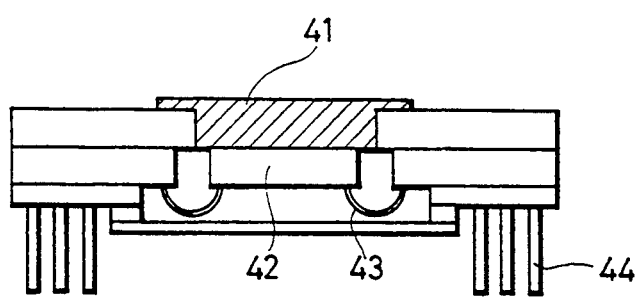
FIG. 6 is a sectional view showing a multilayer package to which a heat transfer insulated part according to the example 6 according to the present invention is attached.

FIG. 6 is a sectional view showing a multilayer package employing a heat transfer insulated part obtained in this way as a heat transfer cap portion. Referring to FIG. 6, a heat transfer cap portion 41 is provided on an LSI chip 42. 43 denotes a bonding wire and 44 denotes a pin.

The MLCP showed excellent airtightness and heat dissipation capacity.

EXAMPLE 7

A sintered alloy of composition of 10%Cu-90%W is coated with W with a thickness of 5 μm to form a barrier layer. Subsequently, by the ion plating method, a $SiO_2$ film with a thickness of 3 μm is formed to form an insulating ceramic layer.

Figure 7:
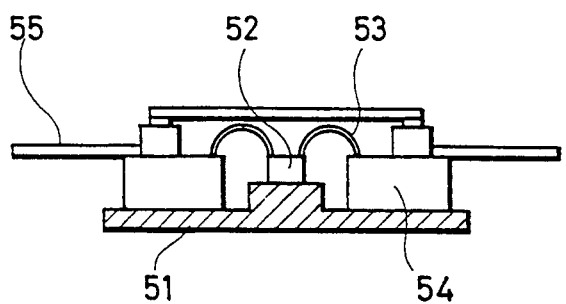
FIG. 7 is a sectional view showing a package employing as a flange of a FET a heat transfer insulated part of the example 7 according to the present invention.

FIG. 7 is a sectional view showing a package using the heat transfer insulating part obtained in this way as a flange of a FET. Referring to FIG. 7, a Si chip 52 is mounted on a flange 51, and a ceramic frame 54 is provided in the vicinity of flange 51. 53 denotes a bonding wire, and 55 denotes a lead frame.

The package showed excellent airtightness and heat destination capacity.

EXAMPLE 8

A sintered alloy of composition of 20%Cu-80%Mo is coated with Mo with a thickness of 5 μm to form a barrier layer. An intermediate layer with a thickness of 4 μm in which the composition continually changes from TiC to TiN is formed thereon. On the intermediate layer, a $Si_3N_4$ film with a thickness of 3 μm is formed by the plasma CVD method to form an insulating ceramic layer.

The obtained heat transfer insulated part used in an MLCP similar to that of Example 1 implemented a package having excellent airtightness and heat transfer ability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a heat dissipating, electrically insulated component, comprising the following steps:
    (a) forming a heat transfer substrate of a sintered alloy selected from the group consisting of Cu-W alloy and Cu-Mo alloy,
    (b) forming a metal barrier layer on a surface of said substrate, said barrier layer consisting of a metal selected from the group consisting of W and Mo and combinations thereof, and
    (c) forming an electrically insulating ceramic layer on said barrier layer, said barrier layer preventing a copper diffusion from said substrate of one of Cu-W and Cu-Mo into said ceramic layer.

2. The method of claim 1, further comprising the step of forming an intermediate layer between said barrier layer and said ceramic layer for increasing an adhesive bonding between said barrier layer and said ceramic layer.

3. The method of claim 2, wherein said step of forming said intermediate layer is performed by using a carbide or nitride of metals selected from the group consisting of groups IV, V, and VI of the periodic table of elements.

4. The method of claim 2, wherein said step of forming said intermediate layer is performed by applying any one of a CVD method, a plasma CVD method, and an ion plating method.

5. The method of claim 4, wherein said applying is contained until said intermediate layer has a thickness within the range of 1 to 5 $\mu$m.

6. The method of claim 1, wherein said step of forming said barrier layer is performed by applying a thermal or plasma CVD method.

7. The method of claim 6, wherein said step of applying is continued until said barrier layer has a thickness within the range of 1 to 10 $\mu$m.

8. The method of claim 1, wherein said step of forming said ceramic layer is performed by applying any one of a CVD method, a plasma CVD method, and an ion plating method.

9. The method of claim 8, wherein said applying is performed until said ceramic layer has a thickness within the range of 1 to 20 $\mu$m.

10. The method of claim 1, wherein said step of forming said ceramic layer is performed by using a ceramic selected from the group consisting of $Al_2O_3$, $SiO_2$, and $Si_3N_4$.

11. The method of claim 1, wherein said heat transfer substrate is formed of a sintered Cu-W-alloy and said barrier layer is formed of W.

12. The method of claim 1, wherein said heat transfer substrate is formed of a sintered Cu-Mo-alloy and said barrier layer is formed of Mo.

13. The method of claim 2, wherein said intermediate layer is formed of a member selected from the group consisting of TiC, Ti(C,N) and TiN.

* * * * *

UNITED STATES PATENT AND TRADEMARK OFFICE
CERTIFICATE OF CORRECTION

PATENT NO. : 5,356,661
DATED      : October 18, 1994
INVENTOR(S) : Doi et al.

It is certified that error appears in the above-identified patent and that said Letters Patent is hereby corrected as shown below:

Column 8, line 4, replace "contained" by --continued--.

Signed and Sealed this

Twenty-fourth Day of January, 1995

Attest:

BRUCE LEHMAN

*Attesting Officer*       Commissioner of Patents and Trademarks

UNITED STATES PATENT AND TRADEMARK OFFICE
CERTIFICATE OF CORRECTION

PATENT NO. : 5,356,661
DATED : October 18, 1994
INVENTOR(S) : Doi, et. al.

It is certified that error appears in the above-indentified patent and that said Letters Patent is hereby corrected as shown below:

Column 7, line 8, replace "forming" by --providing--.

Signed and Sealed this

Seventh Day of March, 1995

Attest:

BRUCE LEHMAN

Attesting Officer     Commissioner of Patents and Trademarks